US012580545B2

(12) United States Patent
Honda et al.

(10) Patent No.: US 12,580,545 B2
(45) Date of Patent: Mar. 17, 2026

(54) DIFFERENTIAL AMPLIFICATION CIRCUIT

(71) Applicant: Murata Manufacturing Co., Ltd.,
Kyoto (JP)

(72) Inventors: Yuri Honda, Kyoto (JP); **Jun
Enomoto, Kyoto (JP); Satoshi Tanaka**,
Kyoto (JP)

(73) Assignee: Murata Manufacturing Co., Ltd.,
Kyoto (JP)

( * ) Notice: Subject to any disclaimer, the term of this
patent is extended or adjusted under 35
U.S.C. 154(b) by 911 days.

(21) Appl. No.: 17/649,821

(22) Filed: Feb. 3, 2022

(65) Prior Publication Data

US 2022/0247376 A1     Aug. 4, 2022

(30) Foreign Application Priority Data

Feb. 4, 2021     (JP) .................................. 2021-016951

(51) Int. Cl.
*H03F 3/45*          (2006.01)
*H01P 3/08*          (2006.01)
*H03H 7/01*          (2006.01)
(52) U.S. Cl.
CPC ........... *H03H 7/0115* (2013.01); *H01P 3/081*
(2013.01); *H03F 3/45475* (2013.01); *H03F
2200/09* (2013.01); *H03F 2200/171* (2013.01)
(58) Field of Classification Search
CPC ........................................................ H03F 3/45
USPC ................................................. 330/252, 165
See application file for complete search history.

(56) References Cited

U.S. PATENT DOCUMENTS

| | | | | | |
|---|---|---|---|---|---|
| 5,250,910 | A | * | 10/1993 | Yabuki | H03B 5/1847 |
| | | | | | 331/114 |
| 5,787,126 | A | * | 7/1998 | Itoh | H03D 7/165 |
| | | | | | 375/329 |
| 7,724,845 | B2 | * | 5/2010 | Sorrells | H03D 7/00 |
| | | | | | 375/343 |
| 7,860,454 | B2 | * | 12/2010 | Moloudi | H04B 17/104 |
| | | | | | 455/341 |
| 11,190,154 | B2 | * | 11/2021 | Honda | H03F 3/195 |
| 2015/0130539 | A1 | * | 5/2015 | Gorbachov | H03H 7/42 |
| | | | | | 330/252 |
| 2016/0380601 | A1 | * | 12/2016 | Cam | H03F 3/45475 |
| | | | | | 330/252 |
| 2017/0149394 | A1 | * | 5/2017 | Kao | H03F 3/45076 |

* cited by examiner

*Primary Examiner* — Henry Choe
(74) *Attorney, Agent, or Firm* — McDonald Hopkins LLC

(57)          ABSTRACT

A differential amplification circuit includes a differential
amplifier configured to output a signal including harmonics
and first and second filters configured to reduce level of an
even harmonic included in output from the differential
amplifier. The first and second filters are connected to output
of the differential amplifier. The first filter includes a reso-
nant circuit composed of a capacitor and an inductor and a
resonant circuit composed of a capacitor and the inductor.
The second filter includes a resonant circuit composed of a
capacitor and an inductor and a resonant circuit composed of
a capacitor and the inductor. A center frequency of the first
filter is lower than a center frequency of the even harmonic.
A center frequency of the second filter is higher than the
center frequency of the even harmonic.

12 Claims, 14 Drawing Sheets

DIFFERENTIAL AMPLIFICATION CIRCUIT

CROSS REFERENCE TO RELATED APPLICATION

This application claims priority from Japanese Patent Application No. 2021-016951 filed on Feb. 4, 2021. The content of this application is incorporated herein by reference in its entirety.

BACKGROUND ART

The present disclosure relates to differential amplification circuits.

A differential amplification circuit may include a filter to reduce harmonics. For example, a differential amplification circuit disclosed in U.S. Patent Application Publication No. 2017/0149394 includes a filter for reducing harmonics on an output side of a differential amplifier. Signals whose harmonics are reduced by the filter are output through an impedance matching circuit.

BRIEF SUMMARY

The differential amplification circuit disclosed in the above-mentioned patent document, however, has room for improvement in frequency characteristics of the filter.

The present disclosure provides a differential amplification circuit capable of having a wider frequency range where a harmonic is reduced by a filter.

A differential amplification circuit according to an aspect of the present disclosure includes a differential amplifier configured to output a signal including harmonics and first and second filters configured to reduce level of an even harmonic included in output from the differential amplifier. The first and second filters are connected to output of the differential amplifier. A center frequency of the first filter is lower than a center frequency of the even harmonic. A center frequency of the second filter is higher than the center frequency of the even harmonic.

According to the present disclosure, the frequency range where a harmonic is reduced by the filter in the differential amplification circuit can be wider.

DETAILED DESCRIPTION

Embodiments of a differential amplification circuit according to the present disclosure are described below in detail with reference to the drawings. The present disclosure is not limited by those embodiments. The components in the embodiments include ones that can be replaced easily by those skilled in the art or substantially the same ones. The embodiments are illustrative, and the configurations illustrated in different embodiments can be replaced or combined in part. The description about the items common to those in the first embodiment is omitted as appropriate in the second and subsequent embodiments, and different points are mainly described. In particular, the description about substantially the same operational advantages from substantially the same configurations is omitted as appropriate and is not described one by one in each embodiment.

First Embodiment

[Circuit Configuration]

Figure 1:
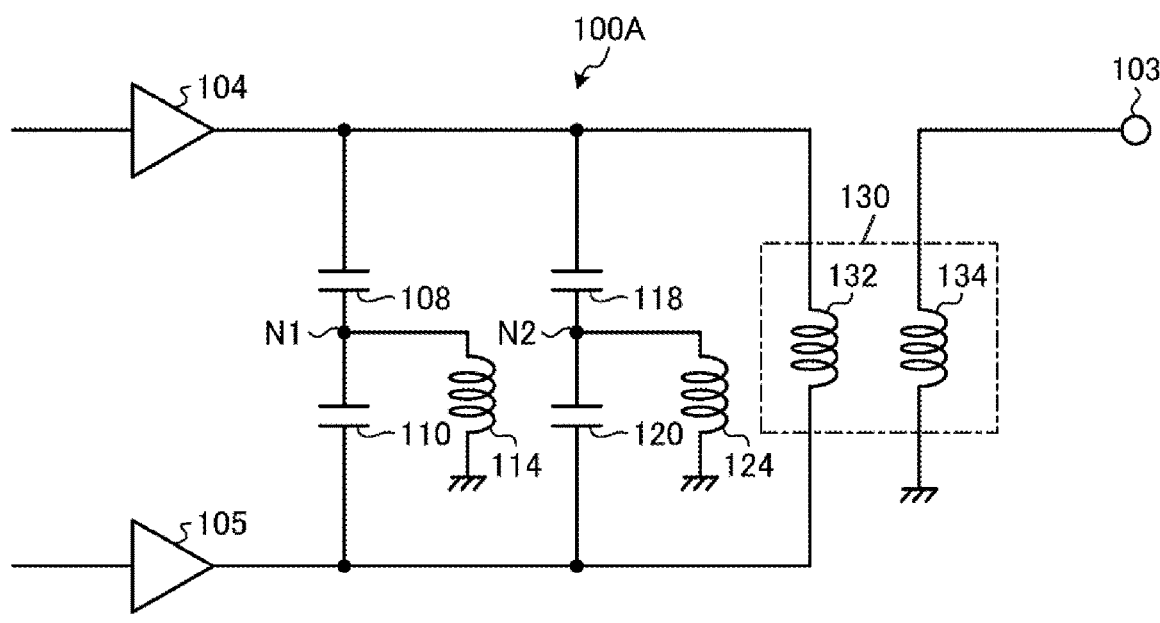
FIG. 1 illustrates a first embodiment of a differential amplification circuit according to the present disclosure.

FIG. 1 illustrates a first embodiment of a differential amplification circuit according to the present disclosure. An example of a differential amplification circuit 100A according to the first embodiment is a subsequent-stage (power-stage) differential amplification circuit disposed on an output side of a first-stage (drive-stage) amplifier circuit (not illustrated). As illustrated in FIG. 1, the differential amplification circuit 100A includes amplifiers 104 and 105, capacitors 108, 110, 118, and 120, inductors 114 and 124, and a balun 130.

A first terminal of the capacitor 108 and a first terminal of the capacitor 118 are connected between the amplifier 104 and the balun 130. A first terminal of the capacitor 110 and a first terminal of the capacitor 120 are connected between the amplifier 105 and the balun 130.

A second terminal of the capacitor 108 and a second terminal of the capacitor 110 are connected. Their connection point is a node N1. A first terminal of the inductor 114 is connected to the node N1. A second terminal of the inductor 114 is connected to a reference potential. An example of the reference potential is a ground potential, but the present disclosure is not limited thereto. The same applies to the description below.

A second terminal of the capacitor 118 and a second terminal of the capacitor 120 are connected. Their connection point is a node N2. A first terminal of the inductor 124 is connected to the node N2. A second terminal of the inductor 124 is connected to a reference potential.

The balun 130 includes an inductor 132 being a primary-side wire and an inductor 134 being a secondary-side wire. The inductor 132 and the inductor 134 are magnetically coupled. Output signal from the amplifier 104 is applied to a first terminal of the inductor 132. Output from amplifier 105 is applied to a second terminal of the inductor 132. A first terminal of the inductor 134 is connected to an output terminal 103. A second terminal of the inductor 134 is connected to a reference potential.

An example of the differential amplification circuit 100A is mounted on a mobile telecommunications device, such as a cellular phone, amplifies power of an input signal to level required for being transmitted to a base station, and outputs it as an output signal. An example of the input signal is a radio frequency (RF) signal modulated by, for example, a radio frequency integrated circuit (RFIC) and the like in accordance with a predetermined telecommunication scheme. Examples of the telecommunication standard for the input signal include the second generation mobile communication system (2G), the third generation mobile communication system (3G), the fourth generation mobile communication system (4G), the fifth generation mobile communication system (5G), the long term evolution (LTE)-frequency division duplex (FDD), the LTE-time division duplex (TDD), the LTE-Advanced, and the LTE-Advanced Pro, and the like. An example of the frequency of the input signal is in the range of approximately several hundred megahertz to several tens of gigahertz. The telecommunication standard for and the frequency of the input signal are not limited to the above examples.

Operations of the differential amplification circuit 100A in the cases where the amplifiers 104 and 105 output harmonic signals can be discussed in terms of mode: differential mode and common mode. The common mode is the operation focusing on even harmonics among harmonics. The differential mode is the operation focusing on odd harmonics among harmonics.

Figure 2:
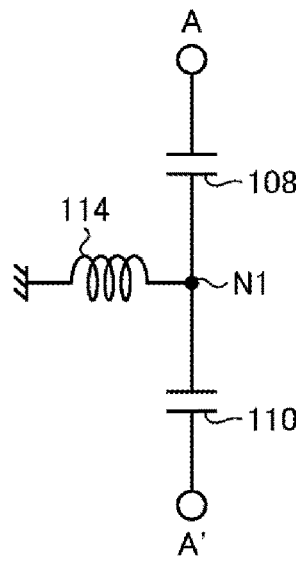
FIG. 2 illustrates a portion of the differential amplification circuit.

Here, the two capacitors 108 and 110 and the inductor 114 in FIG. 1 are discussed. FIG. 2 illustrates a portion of the differential amplification circuit 100A. FIG. 2 illustrates the two capacitors 108 and 110 and the inductor 114. In FIG. 2, a node A is connected to the first terminal of the capacitor 108. The node A is connected to the output of the amplifier 104 in FIG. 1. A node A' is connected to the first terminal of the capacitor 110. The node A' is connected to the output of the amplifier 105 in FIG. 1. The node N1 is the midpoint between the node A and the node A'.

Figure 3:
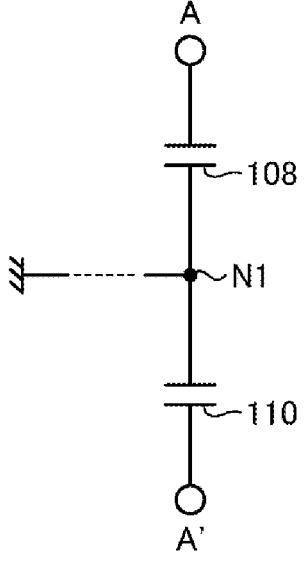
FIG. 3 illustrates behavior of the circuit in FIG. 2 in differential mode.

FIG. 3 illustrates behavior of the circuit in FIG. 2 in differential mode. In differential mode, the node N1, which is the midpoint, is in an imaginary short state to the reference potential. Thus, in differential mode, as seen from the node A, that is, from the amplifier 104, the reference potential can be viewed as being connected after the capacitor 108. In differential mode, as seen from the node A', that is, from the amplifier 105, the reference potential can be viewed as being connected after the capacitor 110. In differential mode, impedance adjustment can be performed on fundamentals by the capacitor 110.

Figure 4:
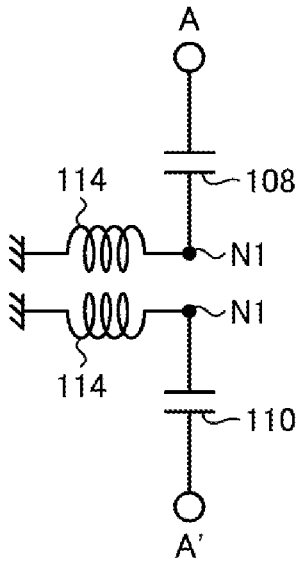
FIG. 4 illustrates behavior of the circuit in FIG. 2 in common mode.

FIG. 4 illustrates behavior of the circuit in FIG. 2 in common mode. In common mode, the node N1 is not in the imaginary short state to the reference potential. Thus, in common mode, as seen from the node A, that is, from the amplifier 104, the reference potential can be viewed as being connected after a series circuit composed of the capacitor 108 and the inductor 114. In common mode, as seen from the node A', that is, from the amplifier 105, the reference potential can be viewed as being connected after a series circuit composed of the capacitor 110 and the inductor 114. The inductance value of the inductor 114 in FIG. 4 is twice the inductance value of the inductor 114 in FIG. 2.

The two capacitors 118 and 120 and the inductor 124 in FIG. 1 can be viewed in the same way as that in FIG. 3 in differential mode and can be viewed in the same way as that in FIG. 4 in common mode.

(Differential Mode)

Figure 5:
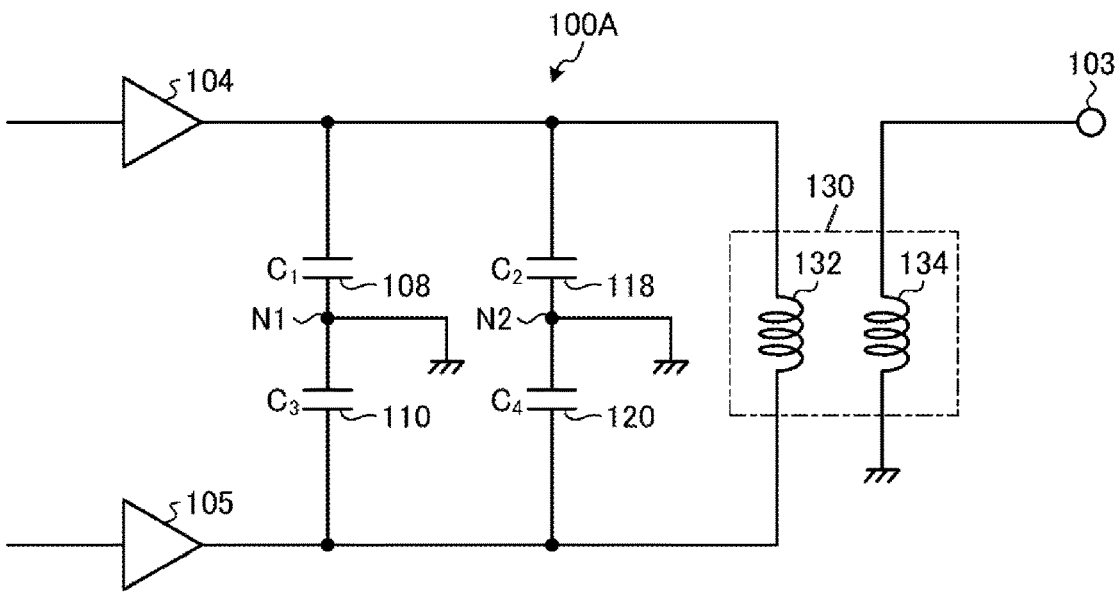
FIG. 5 illustrates the differential amplification circuit in differential mode.

FIG. 5 illustrates the differential amplification circuit 100A in differential mode. As illustrated in FIG. 5, in differential mode, the first terminal of the capacitor 108 can be viewed as being connected to the output of the amplifier 104, and the second terminal of the capacitor 108 can be viewed as being connected to the reference potential. Moreover, in differential mode, the first terminal of the capacitor 118 can be viewed as being connected to the output of the amplifier 104, and the second terminal of the capacitor 118 can be viewed as being connected to the reference potential.

In differential mode, the first terminal of the capacitor 110 can be viewed as being connected to the output of the amplifier 105, and the second terminal of the capacitor 110 can be viewed as being connected to the reference potential. Moreover, in differential mode, the first terminal of the capacitor 120 can be viewed as being connected to the output of the amplifier 105, and the second terminal of the capacitor 120 can be viewed as being connected to the reference potential. The capacitor 108 has a capacitance value C1, the capacitor 118 has a capacitance value C2, the capacitor 110 has a capacitance value C3, and the capacitor 120 has a capacitance value C4.

Figure 6:
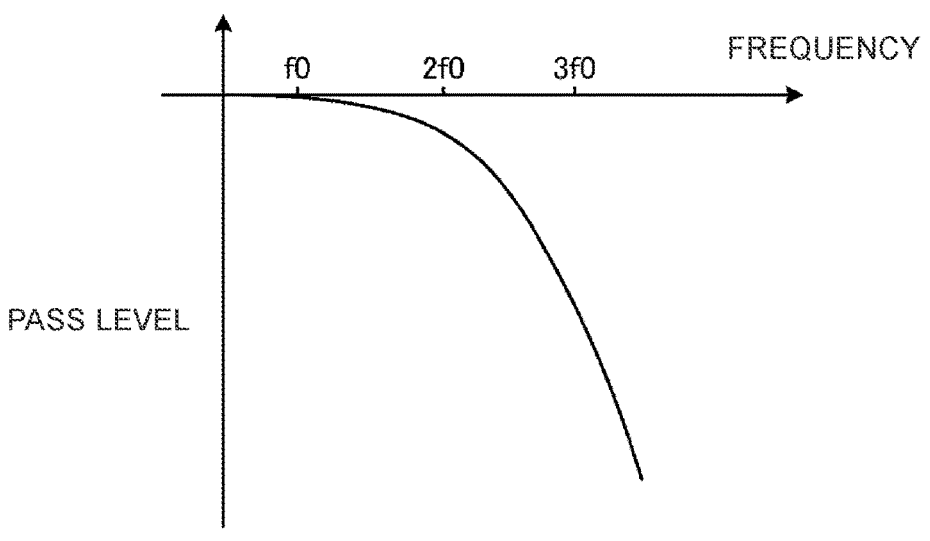
FIG. 6 illustrates frequency characteristics of the differential amplification circuit in differential mode.

FIG. 6 illustrates frequency characteristics of the differential amplification circuit 100A in differential mode. In FIG. 6, the horizontal axis indicates the frequency, and the vertical axis indicates the pass level. As illustrated in FIG. 6, the pass level decreases as the degree of harmonics increases, as illustrated from f0, which is the fundamental frequency, to $2f0$, which is the second harmonic frequency, to $3f0$, which is the third harmonic frequency, to . . . .

(Common Mode)

Figure 7:
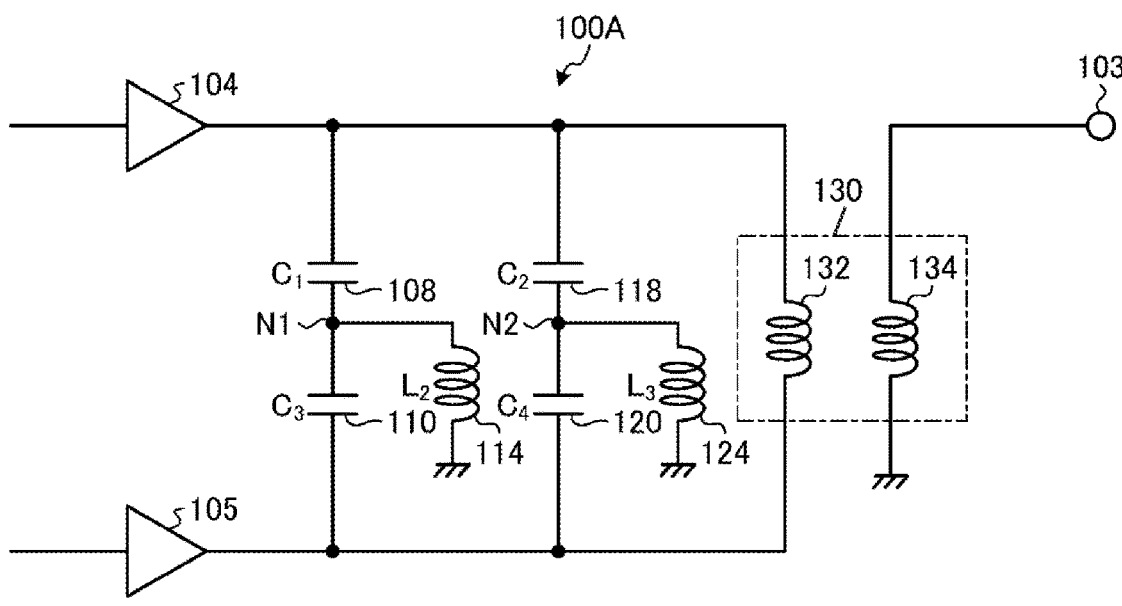
FIG. 7 illustrates the differential amplification circuit in common mode.

FIG. 7 illustrates frequency characteristics of the differential amplification circuit 100A in common mode. As illustrated in FIG. 7, in common mode, the first terminal of the capacitor 108 can be viewed as being connected to the output of the amplifier 104, the second terminal of the capacitor 108 can be viewed as being connected to the first terminal of the inductor 114, and the second terminal of the inductor 114 can be viewed as being connected to the reference potential. Moreover, in common mode, the first terminal of the capacitor 118 can be viewed as being connected to the output of the amplifier 104, the second terminal of the capacitor 118 can be viewed as being connected to the first terminal of the inductor 124, and the second terminal of the inductor 124 can be viewed as being connected to the reference potential.

In common mode, the first terminal of the capacitor 110 can be viewed as being connected to the output of the amplifier 105, the second terminal of the capacitor 110 can be viewed as being connected to the first terminal of the inductor 114, and the second terminal of the inductor 114 can be viewed as being connected to the reference potential. Moreover, in common mode, the first terminal of the capacitor 120 can be viewed as being connected to the output of the amplifier 105, the second terminal of the capacitor 120 can be viewed as being connected to the first terminal of the inductor 124, and the second terminal of the inductor 124 can be viewed as being connected to the reference potential.

In common mode, the capacitor 108 and the inductor 114 operate as a resonant circuit. The resonant circuit composed of the capacitor 108 and the inductor 114 functions as a first filter configured to attenuate the output signal from the amplifier 104. The resonant frequency of that first filter is a frequency fA. The frequency fA is slightly lower than the second harmonic frequency $2f0$. When the capacitance value of the capacitor 108 is C1 and the inductance value of the inductor 114 is L2, the frequency fA can be expressed by Equation (1).

$$fA=\frac{1}{2}\pi(C_1 \times 2L_2)^{1/2} \tag{1}$$

Because the node N1 is the midpoint, the capacitance value C3 of the capacitor 110 is equal to the capacitance value C1 of the capacitor 108. Thus, the resonant frequency of the resonant circuit composed of the capacitor 110 and the inductor 114 is the frequency fA. Being equal in this document is defined as including being equal even when there are differences resulting from manufacturing errors.

In common mode, the capacitor 118 and the inductor 124 operate as a resonant circuit. The resonant circuit composed of the capacitor 118 and the inductor 124 functions as a second filter configured to attenuate the output signal from the amplifier 104. The resonant frequency of that second filter is a frequency fB. The frequency fB is slightly higher than the second harmonic frequency $2f0$. When the capacitance value of the capacitor 118 is C2 and the inductance value of the inductor 124 is L3, the frequency fB can be expressed by Equation (2).

$$fB=\frac{1}{2}\pi(C_2 \times 2L_3)^{1/2} \tag{2}$$

Because the node N2 is the midpoint, the capacitance value C4 of the capacitor 120 is equal to the capacitance value C2 of the capacitor 118. Thus, the resonant frequency of the resonant circuit composed of the capacitor 120 and the inductor 124 is the frequency fB.

Figure 8:
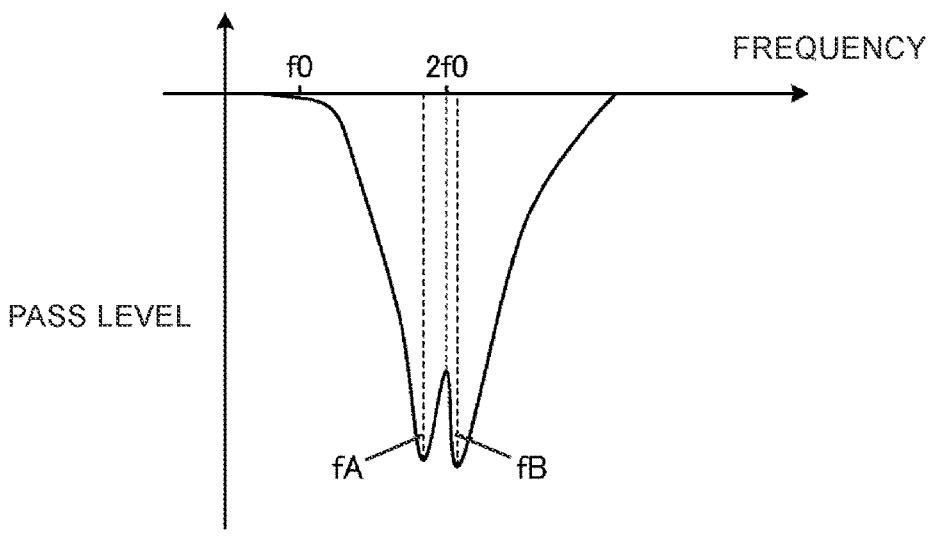
FIG. 8 illustrates frequency characteristics of the differential amplification circuit in common mode.

FIG. 8 illustrates frequency characteristics of the differential amplification circuit 100A in common mode. In FIG. 8, the horizontal axis indicates the frequency, and the vertical axis indicates the pass level. As illustrated in FIG. 8, the frequency fA is slightly lower than the second harmonic frequency $2f0$. That is, the resonant circuit composed of the capacitor 108 and the inductor 114 and the resonant circuit composed of the capacitor 110 and the inductor 114 operate as the first filter in which the pass level is the lowest at the frequency fA. The frequency fB is slightly higher than the second harmonic frequency $2f0$. That is, the resonant circuit composed of the capacitor 118 and the inductor 124 and the resonant circuit composed of the capacitor 120 and the inductor 124 operate as the second filter in which the pass level is the lowest at the frequency fB. The configuration of the resonant circuit achieving the frequency fB may be the capacitor 110 and the inductor 114. The configuration of the resonant circuit achieving the frequency fA may be the capacitor 120 and the inductor 124.

As described with reference to FIG. 8, the frequency fA is slightly lower than the second harmonic frequency $2f0$, and the frequency fB is slightly higher than the second harmonic frequency $2f0$. The frequency fA and the frequency fB differ subtly. That is, the resonant frequencies of the first and second resonant circuits constituting the first and second filters differ subtly.

When the fundamental frequency f0 of signals output from the amplifiers 104 and 105 is not less than f0_1 and not more than f0_2, an example of the second harmonic frequency, that is, the intermediate frequency fcenter1 between the frequency fA and the frequency fB can be expressed by Equation (3).

$$fcenter1=(f0\_1+f0\_2)/2 \times 2 \tag{3}$$

Examples of the frequencies fA and fB can be expressed by Equations (4) and (5).

$$fA \approx fcenter1 \times 0.9 \tag{4}$$

$$fB \leq fcenter1 \times 1.1 \tag{5}$$

That is, the center frequency of the first filter (e.g., frequency fA) is 0.9 times the center frequency of an even harmonic (e.g., frequency fcenter1), and the center frequency of the second filter (e.g., frequency fB) is 1.1 times the center frequency of the even harmonic (e.g., frequency fcenter1).

In that manner, the use of the first and second filters including the first and second resonant circuits whose resonant frequencies are subtly different enables the frequency ranges where pass level decreases to overlap each other. Because the two frequency ranges of those resonant circuits overlap each other, as illustrated in FIG. 8, the pass level in the frequencies lower than the second harmonic frequency $2f0$, which is the center frequency, and the pass level in the frequencies higher than it can decrease.

When the frequency ranges of the resonant circuits having relatively high Q values overlap each other, the ranges where the pass level decreases can be extended. One idea for simply obtaining a wide frequency range is to use only one resonant circuit having a relatively low Q value. In the resonant circuit having the relatively low Q value, however, the decrease in the pass level is not sufficient, and its function as the filter is not obtainable. Thus, in the present disclosure, the first and second resonant circuits having relatively high Q values are used, and the frequency ranges where the pass level decreases overlap each other, thereby achieving a sufficient decrease in the pass level over a relatively wide frequency range.

Here, an example of the relationship among the capacitance value C1 of the capacitor 108, the capacitance value C2 of the capacitor 118, the capacitance value C3 of the capacitor 110, and the capacitance value C4 of the capacitor 120 is C1, C3>C2, C4. If the capacitance value C1 and the capacitance value C2 are equal and relatively small, it is necessary to add a capacitor for achieving impedance matching for the fundamental frequency f0. For example, it may be necessary to add another capacitor between the output of the amplifier 104 and the output of the amplifier 105. In contrast, when the capacitance value C1>the capacitance value C2, desired frequency characteristics are obtainable without necessarily the addition of another capacitor. The same applies to the capacitance value C3 and the capacitance value C4.

When C1, C3>C2, C4, an example of the relationship between the inductance value L2 of the inductor 114 and the inductance value L3 of the inductor 124 is L2<L3.

[Advantages]

As described above, the use of the first and second filters including the first and second resonant circuits whose resonant frequencies are subtly different enables the frequency ranges where the pass level decreases to overlap each other. Thus, the frequency range where the pass level decreases can be wider than the frequency range in the case where a single resonant circuit is used.

Second Embodiment

[Circuit Configuration]

Figure 9:
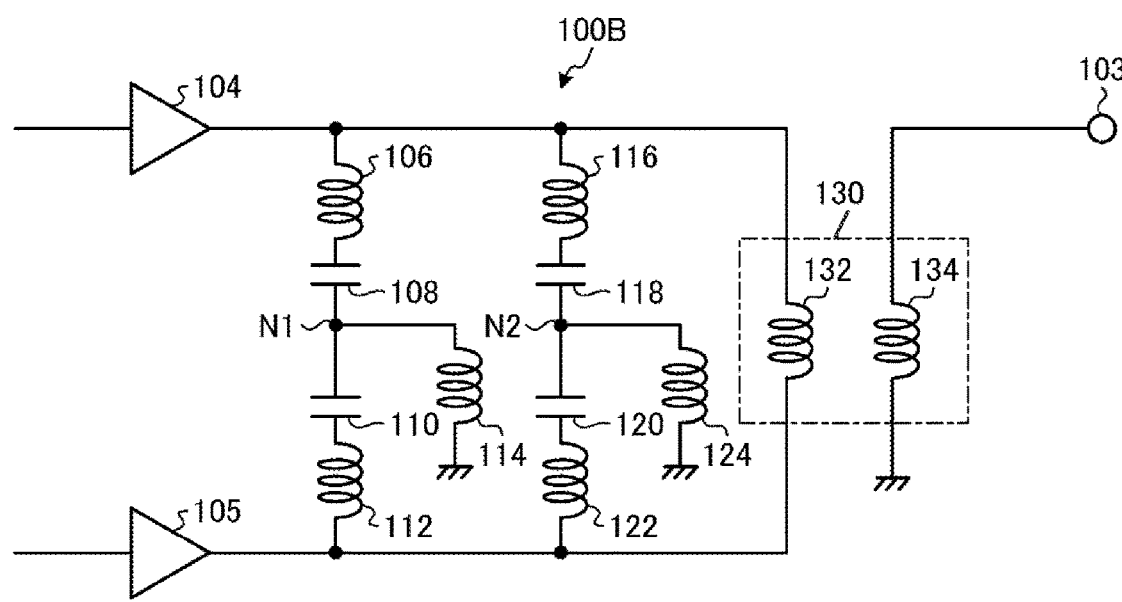
FIG. 9 illustrates a second embodiment of the differential amplification circuit according to the present disclosure.

FIG. 9 illustrates a second embodiment of the differential amplification circuit according to the present disclosure. A differential amplification circuit 100B according to the second embodiment is the configuration in which inductors 106, 112, 116, and 122 are added to the differential amplification circuit 100A according to the first embodiment. A first terminal of the inductor 106 is connected to the output of the amplifier 104, and its second terminal is connected to the first terminal of the capacitor 108. A first terminal of the inductor 116 is connected to the output of the amplifier 104, and its second terminal is connected to the first terminal of the capacitor 118. A first terminal of the inductor 112 is connected to the output of the amplifier 105, and its second terminal is connected to the first terminal of the capacitor 110. A first terminal of the inductor 122 is connected to the output of the amplifier 105, and its second terminal is connected to the first terminal of the capacitor 120.

(Differential Mode)

Figure 10:
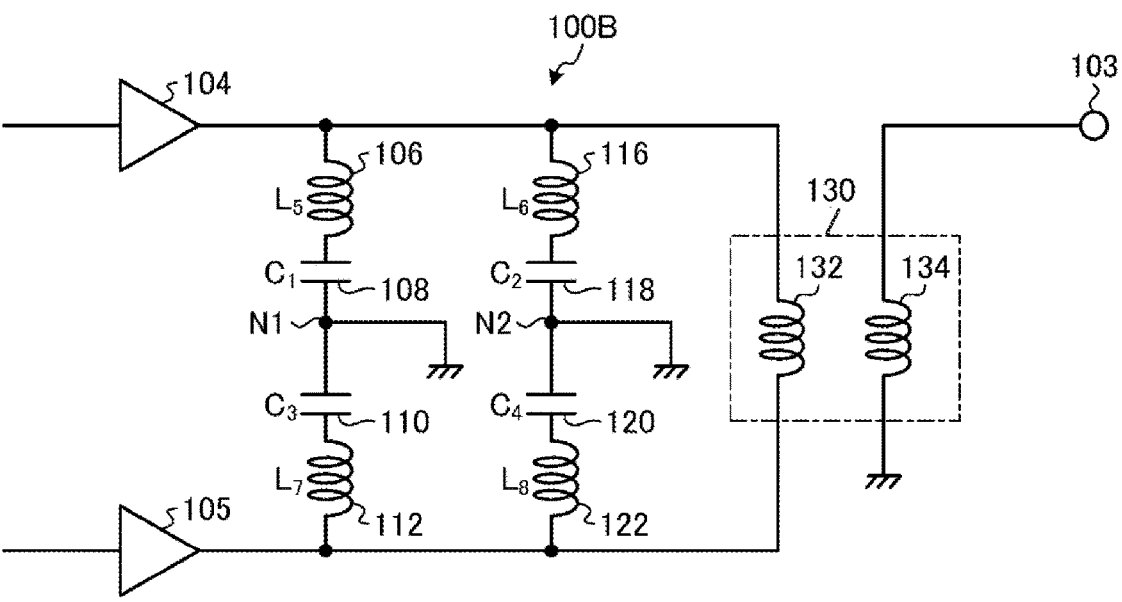
FIG. 10 illustrates the differential amplification circuit in differential mode.

FIG. 10 illustrates the differential amplification circuit 100B in differential mode. As illustrated in FIG. 10, in differential mode, a series resonant circuit composed of the inductor 106 and the capacitor 108 can be viewed as being connected between the output of the amplifier 104 and the node N1. The first terminal of the inductor 106 can be viewed as being connected to the output of the amplifier 104, and the first terminal of the capacitor 108 can be viewed as being connected to the reference potential. Moreover, in differential mode, a series resonant circuit composed of the inductor 116 and the capacitor 118 can be viewed as being connected between the output of the amplifier 104 and the node N2. The first terminal of the inductor 116 can be viewed as being connected to the output of the amplifier 104, and the first terminal of the capacitor 118 can be viewed as being connected to the reference potential.

As illustrated in FIG. 10, in differential mode, a series resonant circuit composed of the inductor 112 and the capacitor 110 can be viewed as being connected between the output of the amplifier 105 and the node N1. The first terminal of the inductor 112 can be viewed as being connected to the output of the amplifier 105, and the first terminal of the capacitor 110 can be viewed as being connected to the reference potential. Moreover, in differential mode, a series resonant circuit composed of the inductor 122 and the capacitor 120 can be viewed as being connected between the output of the amplifier 105 and the node N2. The first terminal of the inductor 122 can be viewed as being connected to the output of the amplifier 105, and the first terminal of the capacitor 120 can be viewed as being connected to the reference potential.

In differential mode, the inductor 106 and the capacitor 108 operate as the series resonant circuit. The resonant frequency of the resonant circuit composed of the inductor 106 and the capacitor 108 is a frequency fC. The frequency fC is slightly lower than the third harmonic frequency 3f0. When the capacitance value of the capacitor 108 is C1 and the inductance value of the inductor 106 is L5, the frequency fC can be expressed by Equation (6).

$$fC = \frac{1}{2}\pi (C_1 \times L_5)^{1/2} \tag{6}$$

Because the node N1 is the midpoint, the capacitance value C3 of the capacitor 110 is equal to the capacitance value C1 of the capacitor 108, and the inductance value L7 of the inductor 112 is equal to the inductance value L5 of the inductor 106. Thus, the resonant frequency of the resonant circuit composed of the inductor 112 and the capacitor 110 is the frequency fC. In the present specification, the capacitance values being equal means the capacitance values being the same within the range of manufacturing variations for capacitors. Likewise, the equal inductance values mean the inductance values being the same within the range of manufacturing variations for inductors. The same applies to the description below.

In differential mode, the inductor 116 and the capacitor 118 operate as the series resonant circuit. The resonant frequency of the resonant circuit composed of the inductor 116 and the capacitor 118 is a frequency fD. The frequency fD is slightly higher than the third harmonic frequency 3f0. When the capacitance value of the capacitor 118 is C2 and the inductance value of the inductor 116 is L6, the frequency fD can be expressed by Equation (7).

$$fD = \frac{1}{2}\pi (C_1 \times L_6)^{1/2} \tag{7}$$

Because the node N2 is the midpoint, the capacitance value C4 of the capacitor 120 is equal to the capacitance value C2 of the capacitor 118, and the inductance value L8 of the inductor 122 is equal to the inductance value L6 of the inductor 116. Thus, the resonant frequency of the series resonant circuit composed of the inductor 122 and the capacitor 120 is the frequency fD.

Figure 11:
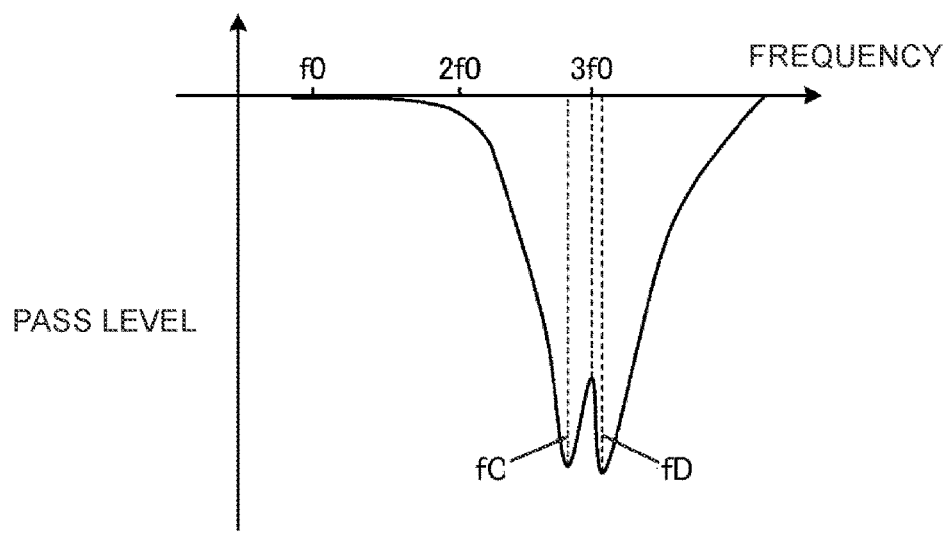
FIG. 11 illustrates frequency characteristics of the differential amplification circuit in differential mode.

FIG. 11 illustrates frequency characteristics of the differential amplification circuit 100B in differential mode. In FIG. 11, the horizontal axis indicates the frequency, and the vertical axis indicates the pass level. As illustrated in FIG. 11, the frequency fC is slightly lower than the third harmonic frequency 3f0. That is, the resonant circuit composed of the inductor 106 and the capacitor 108 and the resonant circuit composed of the inductor 112 and the capacitor 110 operate as the first filter in which the pass level is the lowest at the frequency fC. The frequency fD is slightly higher than the third harmonic frequency 3f0. That is, the resonant circuit composed of the inductor 116 and the capacitor 118 and the resonant circuit composed of the inductor 122 and the capacitor 120 operate as the second filter in which the pass level is the lowest at the frequency fD. Because the frequency characteristics of the two resonant circuits overlap each other, the pass level can decrease over a wide range in which the third harmonic frequency 3f0 is the center frequency.

As described with reference to FIG. 11, the frequency fC is slightly lower than the third harmonic frequency 3f0, and the frequency fD is slightly higher than the third harmonic frequency 3f0. The frequency fC and the frequency fD differ subtly. That is, the resonant frequencies of the first and second resonant circuits constituting the first and second filters differ subtly.

When the fundamental frequency f0 of signals output from the amplifiers 104 and 105 is not less than f0_1 and not more than f0_2, an example of the third harmonic frequency, that is, the intermediate frequency fcenter2 between the frequency fC and the frequency fD can be expressed by Equation (8).

$$fcenter2 = (f0\_1 + f0\_2)/2 \times 3 \tag{8}$$

Examples of the frequencies fC and fD can be expressed by Equations (9) and (10).

$$fC \geq fcenter2 \times 0.9 \qquad (9)$$

$$fD \leq fcenter2 \times 1.1 \qquad (10)$$

(Common Mode)

Figure 12:
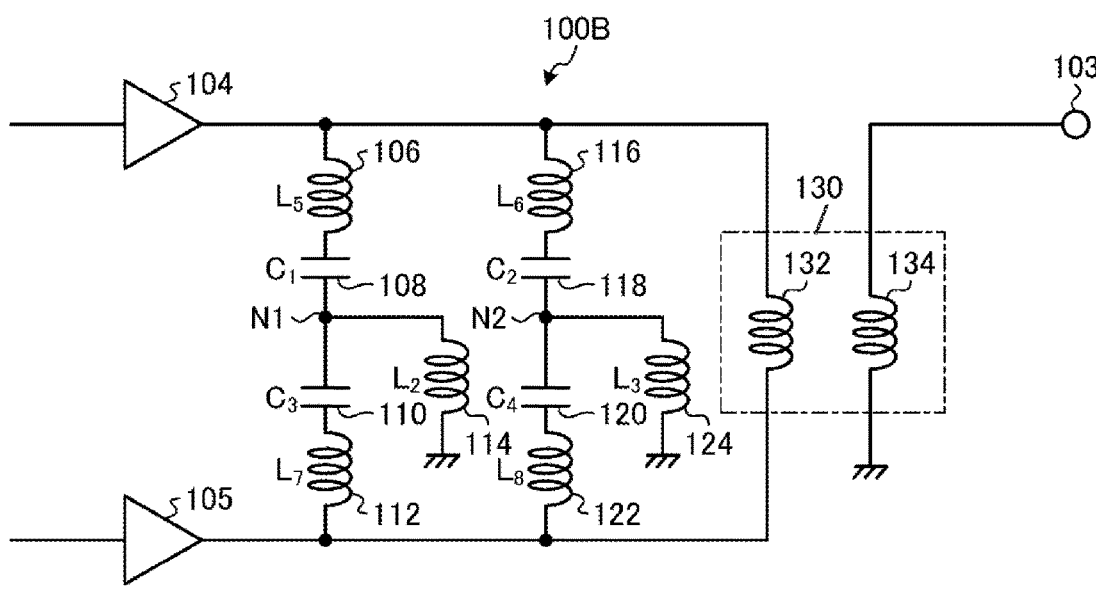
FIG. 12 illustrates the differential amplification circuit in common mode.

FIG. 12 illustrates the differential amplification circuit 100B in common mode. As illustrated in FIG. 12, in common mode, a series resonant circuit composed of the inductor 106, the capacitor 108, and the inductor 114 can be viewed as being connected to the output of the amplifier 104. The first terminal of the inductor 106 can be viewed as being connected to the output of the amplifier 104, and the first terminal of the inductor 114 can be viewed as being connected to the reference potential. Moreover, in common mode, a series resonant circuit composed of the inductor 116, the capacitor 118, and the inductor 124 can be viewed as being connected to the output of the amplifier 104. The first terminal of the inductor 116 can be viewed as being connected to the output of the amplifier 104, and the second terminal of the inductor 124 can be viewed as being connected to the reference potential.

In common mode, a series resonant circuit composed of the inductor 112, the capacitor 110, and the inductor 114 can be viewed as being connected to the output of the amplifier 105. The first terminal of the inductor 112 can be viewed as being connected to the output of the amplifier 105, and the second terminal of the inductor 114 can be viewed as being connected to the reference potential. Moreover, in common mode, a series resonant circuit composed of the inductor 122, the capacitor 120, and the inductor 124 can be viewed as being connected to the output of the amplifier 105. The first terminal of the inductor 122 can be viewed as being connected to the output of the amplifier 105, and the second terminal of the inductor 124 can be viewed as being connected to the reference potential.

In common mode, the inductor 106, the capacitor 108, and the inductor 114 operate as the resonant circuit. The resonant frequency of the resonant circuit composed of the inductor 106, the capacitor 108, and the inductor 114 is a frequency fE. The frequency fE is slightly lower than the second harmonic frequency 2$f$0. When the inductance value of the inductor 106 is L5, the capacitance value of the capacitor 108 is C1, and the inductance value of the inductor 114 is L2, the frequency fE can be expressed by Equation (11).

$$fE = \frac{1}{2}\pi(C_1 \times (L_5 + 2L_2))^{1/2} \qquad (11)$$

Because the node N1 is the midpoint, the inductance value L7 of the inductor 112 is equal to the inductance value L5 of the inductor 106, and the capacitance value C3 of the capacitor 110 is equal to the capacitance value C1 of the capacitor 108. Thus, the resonant frequency of the resonant circuit composed of the inductor 112, the capacitor 110, and the inductor 114 is the frequency fE.

In common mode, the inductor 116, the capacitor 118, and the inductor 124 operate as a resonant circuit. The resonant frequency of the resonant circuit composed of the inductor 116, the capacitor 118, and the inductor 124 is a frequency fF. The frequency fF is slightly higher than the second harmonic frequency 2$f$0. When the inductance value of the inductor 116 is L6, the capacitance value of the capacitor 118 is C2, and the inductance value of the inductor 124 is L3, the frequency fF can be expressed by Equation (12).

$$fF = \frac{1}{2}\pi(C_2 \times (L_6 + 2L_3))^{1/2} \qquad (12)$$

Because the node N2 is the midpoint, the inductance value L8 of the inductor 122 is equal to the inductance value L6 of the inductor 116, and the capacitance value C4 of the capacitor 120 is equal to the capacitance value C2 of the capacitor 118. Thus, the resonant frequency of the resonant circuit composed of the inductor 122, the capacitor 120, and the inductor 124 is the frequency fF.

Figure 13:
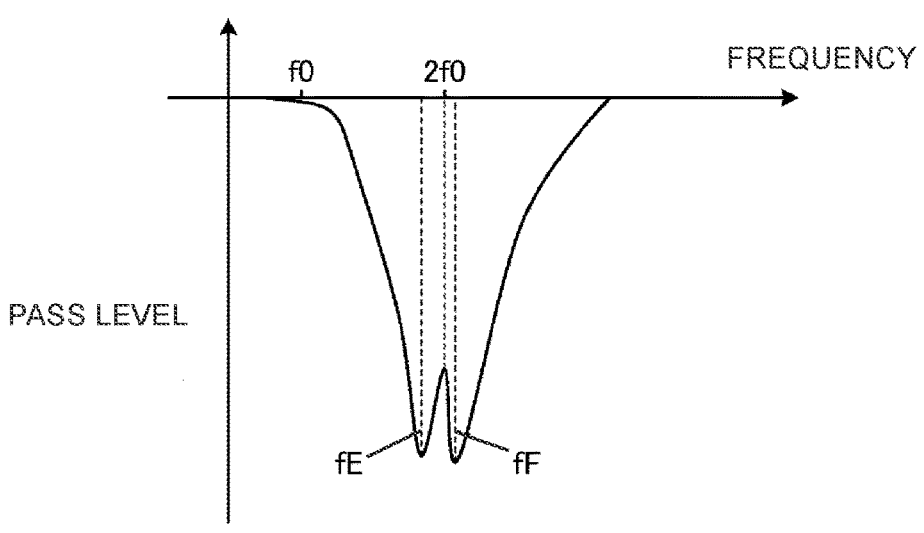
FIG. 13 illustrates frequency characteristics of the differential amplification circuit in common mode.

FIG. 13 illustrates frequency characteristics of the differential amplification circuit 100B in common mode. In FIG. 13, the horizontal axis indicates the frequency, and the vertical axis indicates the pass level. FIG. 13 reveals that the pass level can decrease over a wide range in which the second harmonic frequency 2$f$0 is the center frequency.

As described with reference to FIG. 13, the frequency fE is slightly lower than the second harmonic frequency 2$f$0, and the frequency fF is slightly higher than the second harmonic frequency 2$f$0. The frequency fE and the frequency fF differ subtly. That is, the resonant frequencies of the first and second resonant circuits constituting the first and second filters differ subtly.

When the fundamental frequency $f$0 of signals output from the amplifiers 104 and 105 is not less than $f$0_1 and not more than $f$0_2, an example of the second harmonic frequency, that is, the intermediate frequency fcenter3 between the frequency fE and the frequency fF can be expressed by Equation (13).

$$fcenter3 = (f0\_1 + f0\_2)/2 \times 2 \qquad (13)$$

Examples of the frequencies fE and fF can be expressed by Equations (14) and (15).

$$fE \geq fcenter3 \times 0.9 \qquad (14)$$

$$fF \leq fcenter3 \times 1.1 \qquad (15)$$

An example of the relationship among the capacitance value C1 of the capacitor 108, the capacitance value C2 of the capacitor 118, the capacitance value C3 of the capacitor 110, and the capacitance value C4 of the capacitor 120 is C1, C3>C2, C4. An example of the relationship between the inductance value L2 of the inductor 114 and the inductance value L3 of the inductor 124 is L2<L3.

[Advantages]

As described above, the use of the first and second resonant circuits whose resonant frequencies are subtly different enables the frequency ranges where the pass level decreases to overlap each other. Because the two frequency ranges of those resonant circuits overlap each other, as illustrated in FIG. 13, the pass level in the frequencies lower than the second harmonic frequency 2$f$0, which is the center frequency, and the pass level in the frequencies higher than it can decrease.

Third Embodiment

[Circuit Configuration]

Figure 14:
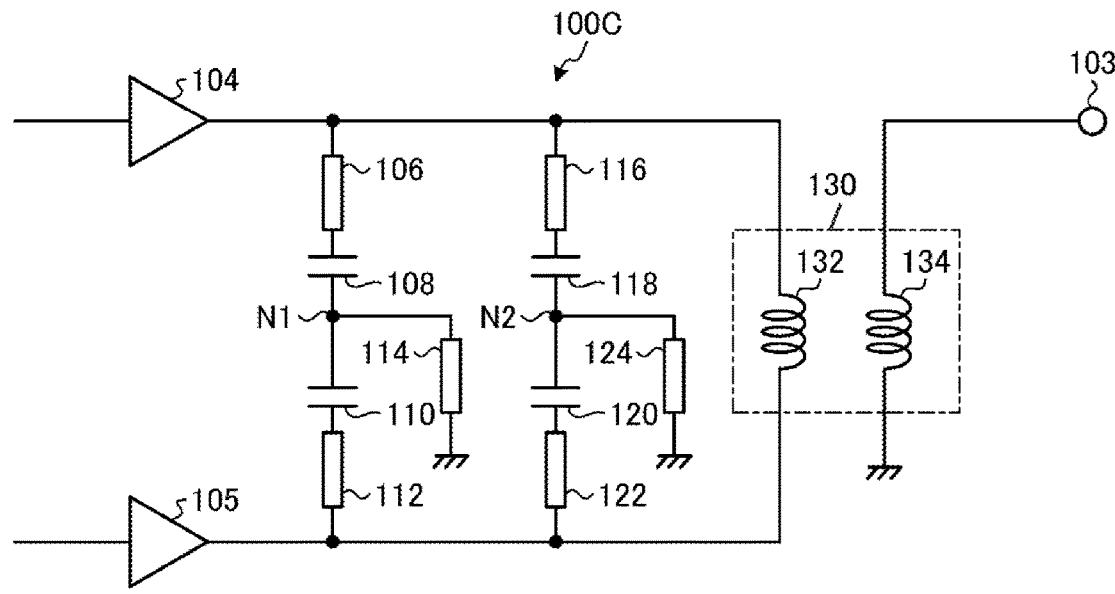
FIG. 14 illustrates a third embodiment of the differential amplification circuit according to the present disclosure.

FIG. 14 illustrates a third embodiment of the differential amplification circuit according to the present disclosure. A differential amplification circuit 100C according to the third embodiment is the configuration in which the inductors 106, 112, 114, 116, 122, and 124 included in the differential amplification circuit 100B according to the second embodiment are replaced with microstrip lines and strip lines. That is, the inductors are achieved by the microstrip lines and strip lines. The first terminal of the inductor 106 is connected to the output of the amplifier 104, and its second terminal is connected to the first terminal of the capacitor 108. The first terminal of the inductor 116 is connected to the output of the amplifier 104, and its second terminal is connected to the first terminal of the capacitor 118. The first terminal of the inductor 112 is connected to the output of the amplifier 105, and its second terminal is connected to the first terminal of the capacitor 110. The first terminal of the inductor 122 is connected to the output of the amplifier 105, and its second terminal is connected to the first terminal of the capacitor 120.

(Differential Mode)

Figure 15:
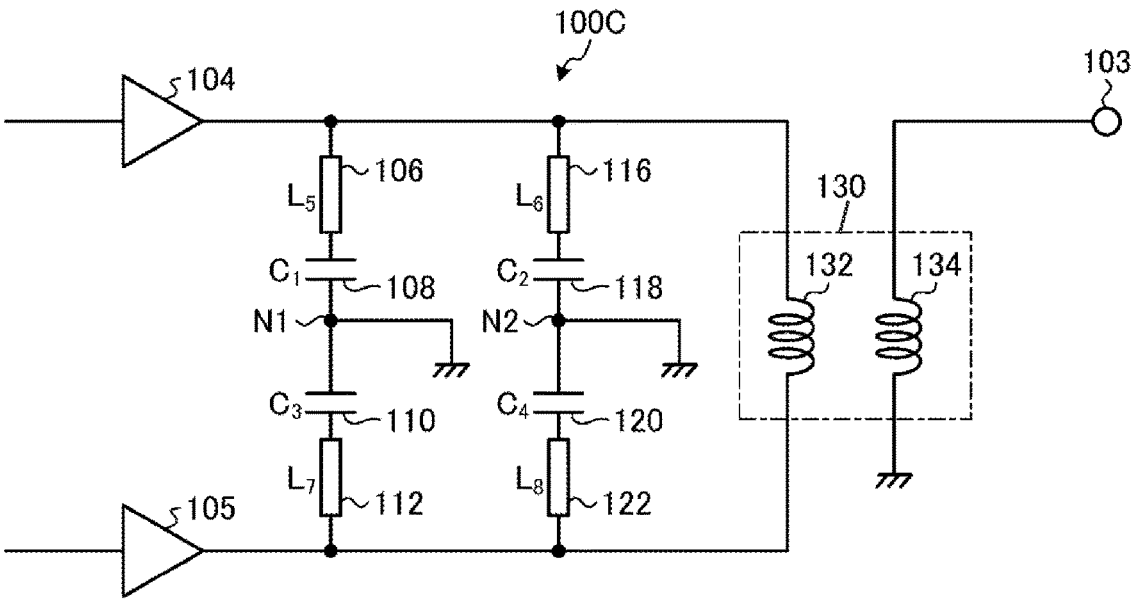
FIG. 15 illustrates the differential amplification circuit in differential mode.

FIG. 15 illustrates the differential amplification circuit 100C in differential mode. As illustrated in FIG. 15, in differential mode, the series resonant circuit composed of the inductor 106 and the capacitor 108 can be viewed as being connected between the output of the amplifier 104 and the node N1. Moreover, in differential mode, the series resonant circuit composed of the inductor 116 and the capacitor 118 can be viewed as being connected between the output of the amplifier 104 and the node N2.

As illustrated in FIG. 15, in differential mode, as in the case of FIG. 10, the series resonant circuit composed of the inductor 112 and the capacitor 110 can be viewed as being connected between the output of the amplifier 105 and the node N1. Moreover, in differential mode, the series resonant circuit composed of the inductor 122 and the capacitor 120 can be viewed as being connected between the output of the amplifier 105 and the node N2.

The resonant frequency of the resonant circuit composed of the inductor 106 and the capacitor 108 is the frequency fC. The frequency fC is slightly lower than the third harmonic frequency $3f0$.

Because the node N1 is the midpoint, the capacitance value C3 of the capacitor 110 is equal to the capacitance value C1 of the capacitor 108, and the inductance value L7 of the inductor 112 is equal to the inductance value L5 of the inductor 106. Thus, the characteristic impedances and electrical lengths of the microstrip lines and strip lines achieving the inductor 112 and the inductor 106 are equal to each other. Thus, the resonant frequency of the resonant circuit composed of the inductor 112 and the capacitor 110 is the frequency fC.

The resonant frequency of the resonant circuit composed of the inductor 116 and the capacitor 118 is the frequency fD. The frequency fD is slightly higher than the third harmonic frequency $3f0$.

Because the node N2 is the midpoint, the capacitance value C4 of the capacitor 120 is equal to the capacitance value C2 of the capacitor 118, and the inductance value L8 of the inductor 122 is equal to the inductance value L6 of the inductor 116. That is, the characteristic impedances and electrical lengths of the microstrip lines and strip lines achieving the inductor 122 and the inductor 116 are equal to each other. Thus, the resonant frequency of the resonant circuit composed of the inductor 122 and the capacitor 120 is the frequency fD.

Figure 16:
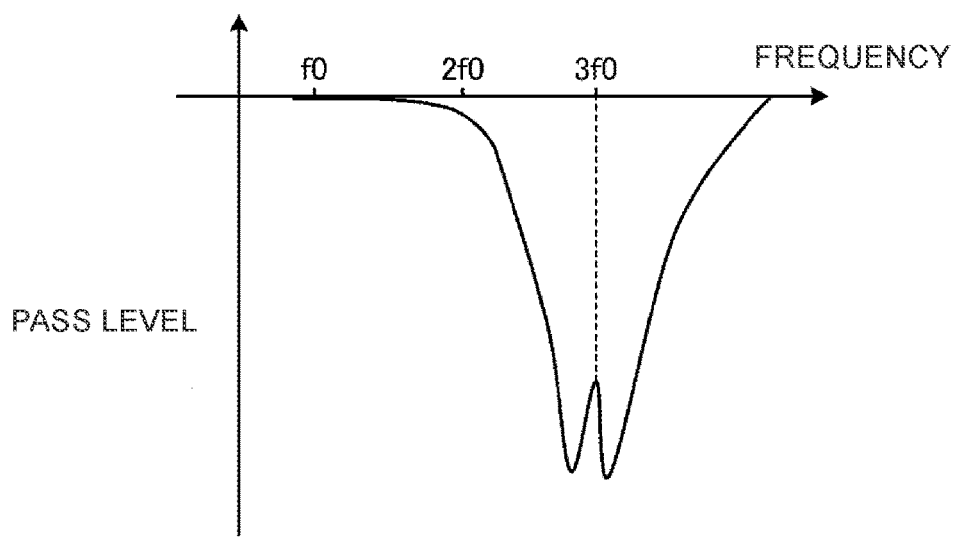
FIG. 16 illustrates frequency characteristics of the differential amplification circuit in FIG. 14 in differential mode.

FIG. 16 illustrates frequency characteristics of the differential amplification circuit 100C in FIG. 14 in differential mode. In FIG. 16, the horizontal axis indicates the frequency, and the vertical axis indicates the pass level. As illustrated in FIG. 16, because the frequency characteristics of the two resonant circuits overlap each other, the pass level can decrease over a wide range in which the third harmonic frequency $3f0$ is the center frequency.

(Common Mode)

Figure 17:
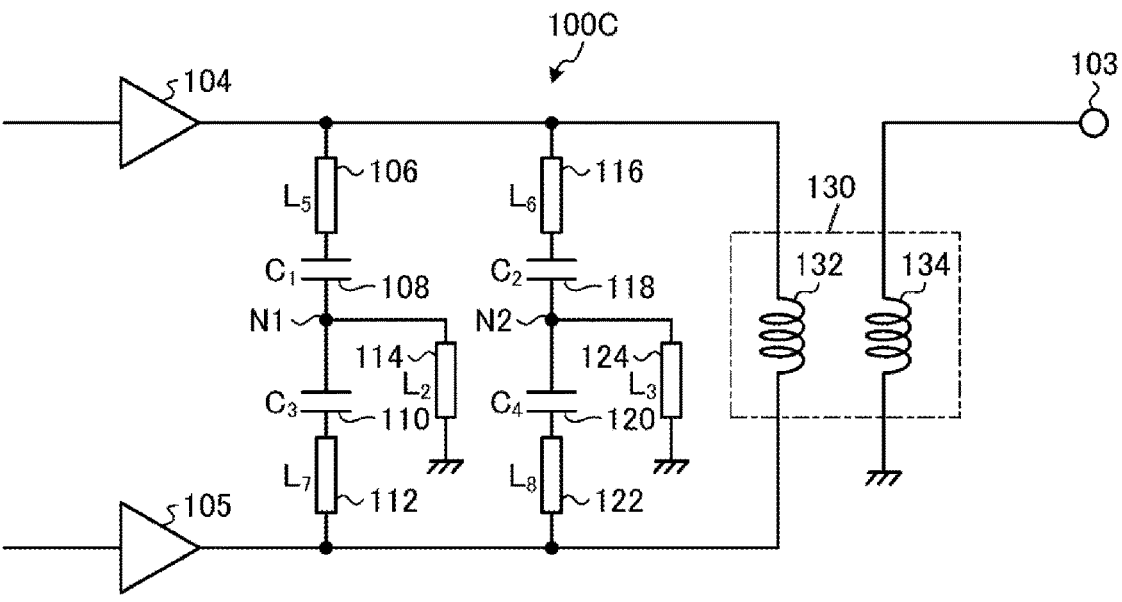
FIG. 17 illustrates the differential amplification circuit in common mode.

FIG. 17 illustrates the differential amplification circuit 100C in common mode. As illustrated in FIG. 17, in common mode, as in the case of FIG. 12, the series resonant circuit composed of the inductor 106, the capacitor 108, and the inductor 114 can be viewed as being connected to the output of the amplifier 104. Moreover, in common mode, the series resonant circuit composed of the inductor 116, the capacitor 118, and the inductor 124 can be viewed as being connected to the output of the amplifier 104.

In common mode, as in the case of FIG. 12, the series resonant circuit composed of the inductor 112, the capacitor 110, and the inductor 114 can be viewed as being connected to the output of the amplifier 105. Moreover, in common mode, the series resonant circuit composed of the inductor 122, the capacitor 120, and the inductor 124 can be viewed as being connected to the output of the amplifier 105. The first terminal of the inductor 122 can be viewed as being connected to the output of the amplifier 105, and the second terminal of the inductor 124 can be viewed as being connected to the reference potential.

In common mode, the inductor 106, the capacitor 108, and the inductor 114 operate as the resonant circuit. The resonant frequency of the resonant circuit composed of the inductor 106, the capacitor 108, and the inductor 114 is the frequency fE. The frequency fE is slightly lower than the second harmonic frequency $2f0$.

Because the node N1 is the midpoint, the inductance value L7 of the inductor 112 is equal to the inductance value L5 of the inductor 106, and the capacitance value C3 of the capacitor 110 is equal to the capacitance value C1 of the capacitor 108. That is, the characteristic impedances and electrical lengths of the microstrip lines and strip lines achieving the inductor 112 and the inductor 106 are equal to each other. Thus, the resonant frequency of the resonant circuit composed of the inductor 112, the capacitor 110, and the inductor 114 is the frequency fE.

In common mode, the inductor 116, the capacitor 118, and the inductor 124 operate as the resonant circuit. The resonant frequency of the resonant circuit composed of the inductor 116, the capacitor 118, and the inductor 124 is the frequency fF. The frequency fF is slightly higher than the second harmonic frequency $2f0$.

Because the node N2 is the midpoint, the inductance value L8 of the inductor 122 is equal to the inductance value L6 of the inductor 116, and the capacitance value C4 of the capacitor 120 is equal to the capacitance value C2 of the capacitor 118. Thus, the resonant frequency of the resonant circuit composed of the inductor 122, the capacitor 120, and the inductor 124 is the frequency fF.

Figure 18:
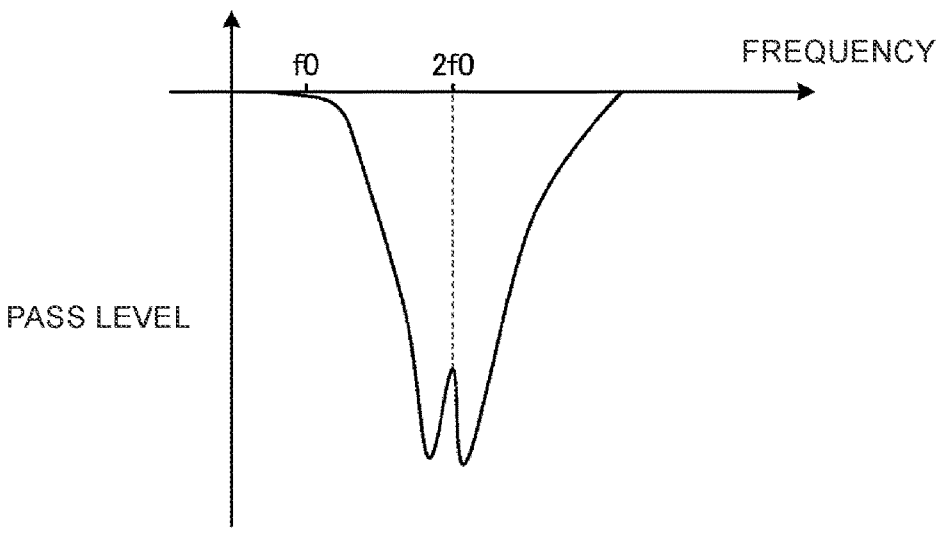
FIG. 18 illustrates frequency characteristics of the differential amplification circuit in FIG. 14 in common mode.

FIG. 18 illustrates frequency characteristics of the differential amplification circuit 100C in FIG. 14 in common mode. In FIG. 18, the horizontal axis indicates the frequency, and the vertical axis indicates the pass level. FIG. 18 reveals that the pass level can decrease over a wide range in which the second harmonic frequency $2f0$ is the center frequency.

Not all of the inductors 106, 112, 114, 116, 122, and 124 in FIG. 14, that is, only some of them may be replaced with microstrip lines and strip lines. That is, at least one of the inductors 106, 112, 114, 116, 122, and 124 included in the differential amplification circuit 100B according to the second embodiment may be achieved by a microstrip line and a strip line.

An example of the relationship among the capacitance value C1 of the capacitor 108, the capacitance value C2 of the capacitor 118, the capacitance value C3 of the capacitor 110, and the capacitance value C4 of the capacitor 120 is C1, C3>C2, C4. An example of the relationship between the inductance value L2 of the inductor 114 and the inductance value L3 of the inductor 124 is L2<L3.

[Advantages]

As described above, the use of the first and second resonant circuits whose resonant frequencies are subtly different enables the frequency ranges where the pass level decreases to overlap each other. Because the two frequency ranges of those resonant circuits overlap each other, as illustrated in FIG. 18, the pass level in the frequencies lower than the second harmonic frequency $2f0$, which is the center frequency, and the pass level in the frequencies higher than it can decrease.

Fourth Embodiment

[Circuit Configuration]

Figure 19:
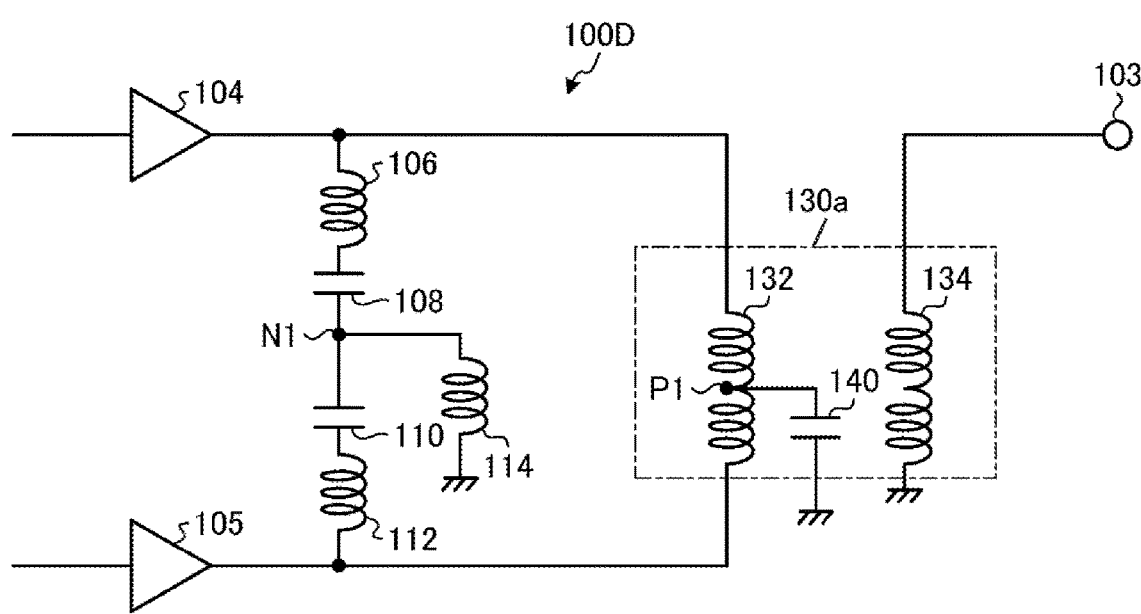
FIG. 19 illustrates a fourth embodiment of the differential amplification circuit according to the present disclosure.

FIG. 19 illustrates a fourth embodiment of the differential amplification circuit according to the present disclosure. A differential amplification circuit 100D according to the fourth embodiment includes the resonant circuit composed of the inductor 106, the capacitor 108, and the inductor 114 and the resonant circuit composed of the inductor 112, the capacitor 110, and the inductor 114, similarly to the differential amplification circuit 100B according to the second embodiment. In the differential amplification circuit 100D according to the fourth embodiment, those resonant circuits function as the first filter.

The differential amplification circuit 100D according to the fourth embodiment includes a capacitor 140. A first terminal of the capacitor 140 is connected to a midpoint P1 of the inductor 132, which is a primary-side wire in a balun 130a. A second terminal of the capacitor 140 is connected to a reference potential. The inductor 132 and the inductor 134 in the balun 130a are magnetically coupled. The inductor 132 and the capacitor 140 constitute a resonant circuit. In the differential amplification circuit 100D according to the fourth embodiment, the resonant circuit composed of the inductor 132, which is the primary-side wire in the balun 130a, and the third capacitor 140 functions as the second filter.

The resonant frequency of the resonant circuit composed of the inductor 132 and the capacitor 140 is higher than the resonant frequency of the resonant circuit composed of the inductor 106, the capacitor 108, and the inductor 114. The resonant frequency of the resonant circuit composed of the inductor 132 and the capacitor 140 is higher than the resonant frequency of the resonant circuit composed of the inductor 112, the capacitor 110, and the inductor 114. The differential amplification circuit 100D does not include the resonant circuit composed of the inductor 116, the capacitor 118, and the inductor 124 and the resonant circuit composed of the inductor 122, the capacitor 120, and the inductor 124, both resonant circuits being included in the differential amplification circuit 100B according to the second embodiment. Thus, the mounting area for the differential amplification circuit 100D according to the fourth embodiment can be reduced, in comparison with that for the differential amplification circuit 100B according to the second embodiment.

(Differential Mode)

Figure 20:
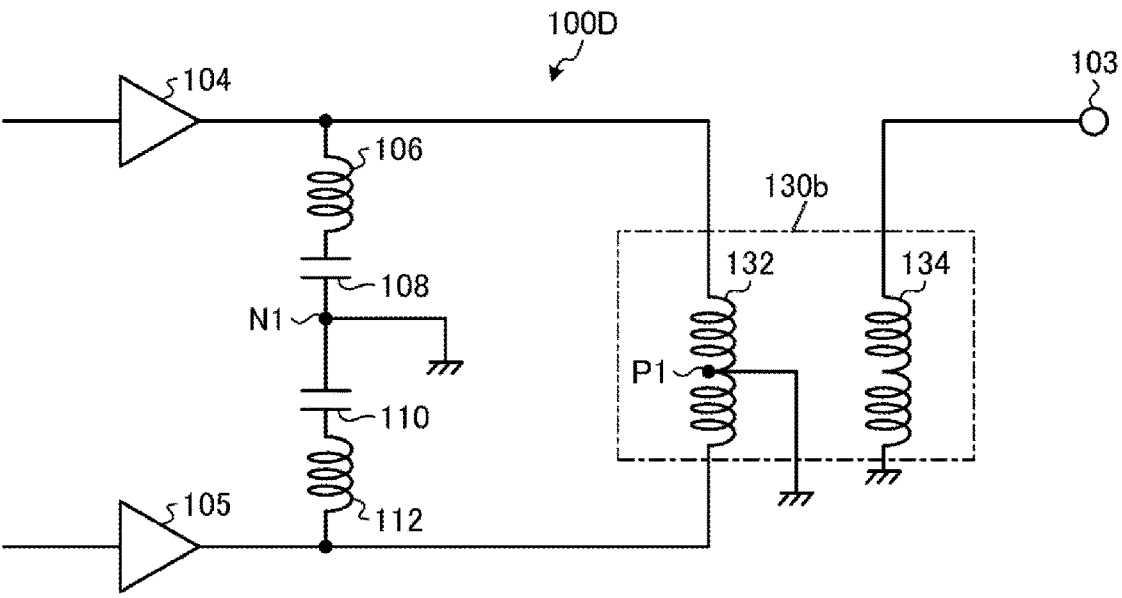
FIG. 20 illustrates the differential amplification circuit in differential mode.

FIG. 20 illustrates the differential amplification circuit 100D in differential mode. As illustrated in FIG. 20, in differential mode, as in the case of FIG. 10, the series resonant circuit composed of the inductor 106 and the capacitor 108 can be viewed as being connected between the output of the amplifier 104 and the node N1. Moreover, in differential mode, the series resonant circuit composed of the inductor 112 and the capacitor 110 can be viewed as being connected between the output of the amplifier 105 and the node N1.

Figure 21:
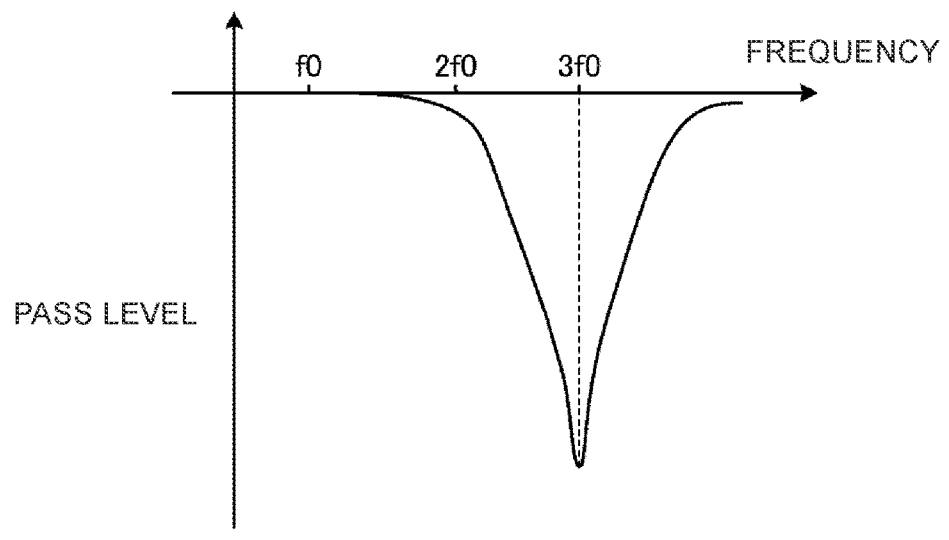
FIG. 21 illustrates frequency characteristics of the differential amplification circuit in FIG. 19 in differential mode.

FIG. 21 illustrates frequency characteristics of the differential amplification circuit in FIG. 19 in differential mode. In FIG. 21, the horizontal axis indicates the frequency, and the vertical axis indicates the pass level. FIG. 21 reveals that the pass level can decrease over a wide range in which the third harmonic frequency $3f0$ is the center frequency.

(Common Mode)

Figure 22:
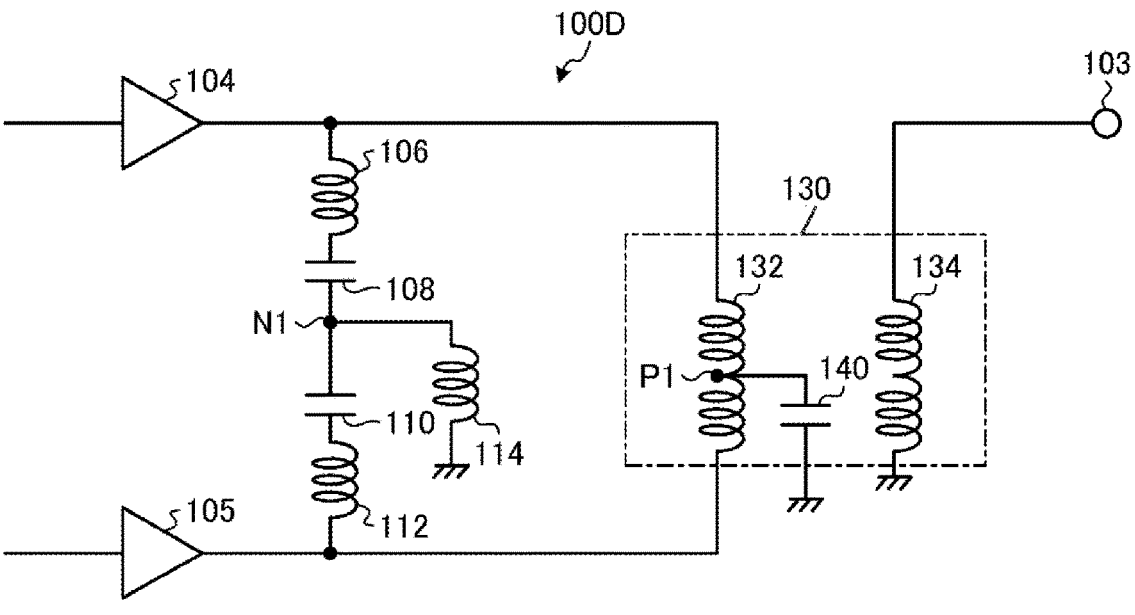
FIG. 22 illustrates the differential amplification circuit in common mode.

FIG. 22 illustrates the differential amplification circuit 100D in common mode. As illustrated in FIG. 22, in common mode, as in the case of FIG. 12, the series resonant circuit composed of the inductor 106, the capacitor 108, and the inductor 114 can be viewed as being connected to the output of the amplifier 104, and the series resonant circuit composed of the inductor 132 and the capacitor 140 can be viewed as being connected thereto. Moreover, in common mode, the series resonant circuit composed of the inductor 112, the capacitor 110, and the inductor 114 can be viewed as being connected to the output of the amplifier 105, and the series resonant circuit composed of the inductor 132 and the capacitor 140 can be viewed as being connected thereto.

Figure 23:
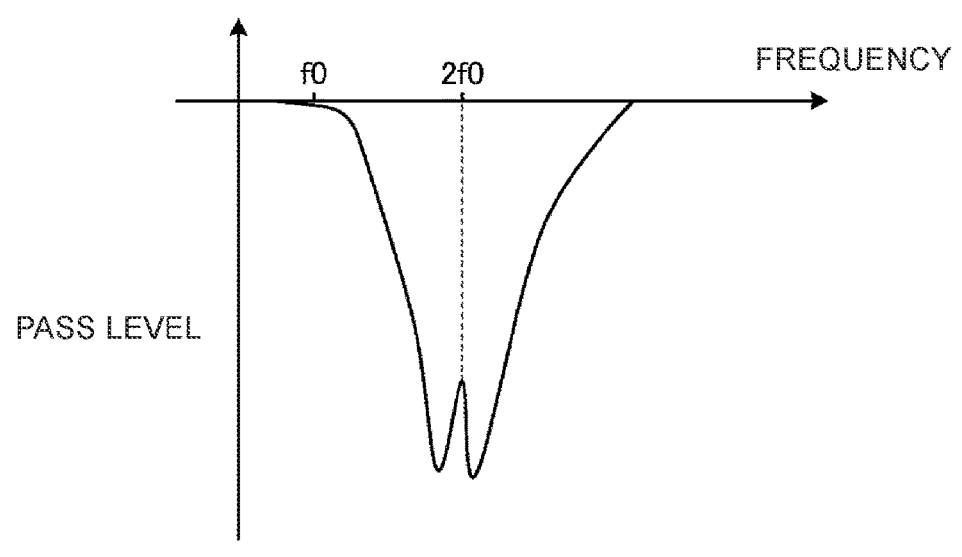
FIG. 23 illustrates frequency characteristics of the differential amplification circuit in FIG. 19 in common mode.

FIG. 23 illustrates frequency characteristics of the differential amplification circuit in FIG. 19 in common mode. In FIG. 23, the horizontal axis indicates the frequency, and the vertical axis indicates the pass level. FIG. 23 reveals that the pass level can decrease over a wide range in which the second harmonic frequency $2f0$ is the center frequency.

Fifth Embodiment

Figure 24:
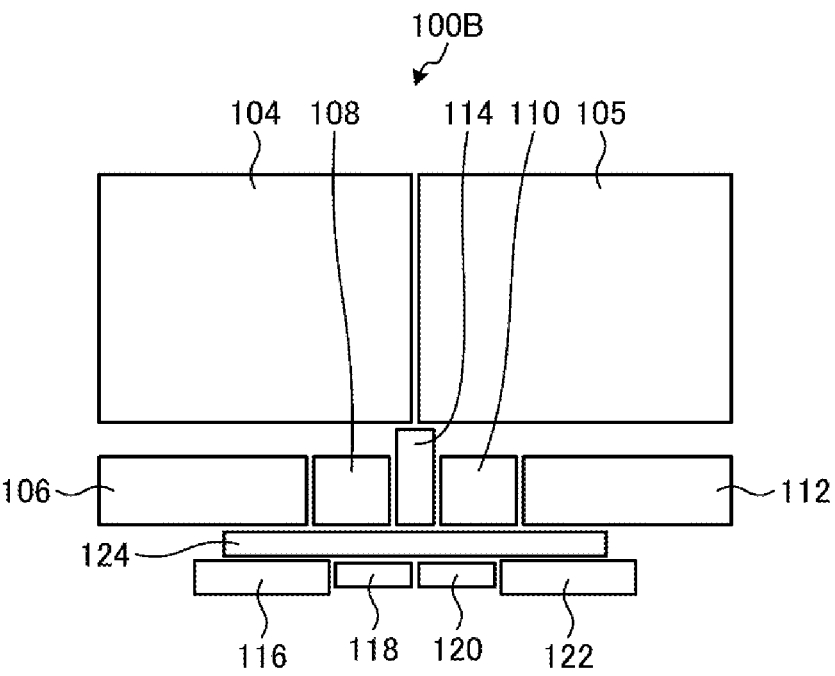
FIG. 24 illustrates a fifth embodiment of the differential amplification circuit according to the present disclosure.

FIG. 24 illustrates a fifth embodiment of the differential amplification circuit according to the present disclosure. FIG. 24 illustrates an example of a layout of the differential amplification circuit 100B according to the second embodiment illustrated in FIG. 9.

[Configuration]

As illustrated in FIG. 24, in this example, the inductor 106 and the capacitor 108 are disposed on an output side of the amplifier 104. The inductor 112 and the capacitor 110 are disposed on an output side of the amplifier 105. The inductor 114 is disposed in the vicinity of the capacitor 108 and the capacitor 110. An example of the vicinity of the capacitor 108 and the capacitor 110 is a position where the distance from each of the capacitor 108 and the capacitor 110 is not less than 6 μm and not more than 20 μm. Moreover, the inductor 116 and the capacitor 118 are disposed on the output side of the amplifier 104. The inductor 122 and the capacitor 120 are disposed on the output side of the amplifier 105. The inductor 124 is disposed in the vicinity of the capacitor 118 and the capacitor 120. The balun 130 (not illustrated) is connected to the output of each of the amplifier 104 and the amplifier 105.

In FIG. 24, the inductor 106 and the inductor 112 can be symmetrically arranged. The capacitor 108 and the capacitor 110 can be symmetrically arranged. Thus, as described with reference to FIG. 10, the arrangement in which the node N1 illustrated in FIG. 9 is the midpoint in differential mode can be achieved.

Similarly, the inductor 116 and the inductor 122 can be symmetrically arranged. The capacitor 118 and the capacitor 120 can be symmetrically arranged. Thus, as described with reference to FIG. 10, the arrangement in which the node N2 illustrated in FIG. 9 is the midpoint in differential mode can be achieved.

15

[Advantages]

When the layout illustrated in FIG. 24 is employed, the differential amplification circuit 100B according to the second embodiment described with reference to FIG. 9 can be achieved. The arrangement in which the node N1 and the node N2 are the midpoints in differential mode can be achieved. Thus, the frequency characteristics in differential mode described with reference to FIG. 11 and the frequency characteristics in common mode described with reference to FIG. 13 can be achieved.

The layout of the differential amplification circuit 100B according to the second embodiment illustrated in FIG. 9 is described above. Such symmetrical arrangement can also be achieved in the differential amplification circuit 100A according to the first embodiment illustrated in FIG. 1, the differential amplification circuit 100C according to the third embodiment illustrated in FIG. 14, and the differential amplification circuit 100D according to the fourth embodiment illustrated in FIG. 19. Thus, the arrangement in which the nodes N1 and N2 are the midpoints can be achieved.

What is claimed is:

1. A differential amplification circuit comprising:
   a differential amplifier configured to output a signal including harmonics; and
   first and second filters configured to reduce a level of an even harmonic included in the signal output from the differential amplifier,
   wherein the first and second filters are connected to an output of the differential amplifier,
   a center frequency of the first filter is lower than a center frequency of the even harmonic, and
   a center frequency of the second filter is higher than the center frequency of the even harmonic.
2. The differential amplification circuit according to claim 1,
   wherein the first filter comprises a first resonant circuit comprising a first capacitor and a first inductor,
   wherein the second filter comprises a second resonant circuit comprising a second capacitor and a second inductor,
   wherein a capacitance value of the first capacitor is greater than a capacitance value of the second capacitor, and
   wherein an inductance value of the first inductor is less than an inductance value of the second inductor.
3. The differential amplification circuit according to claim 2,
   wherein the first resonant circuit of the first filter further comprises a third inductor, and
   wherein the second resonant circuit of the second filter further comprises a fourth inductor.
4. The differential amplification circuit according to claim 2, wherein the first inductor or the second inductor is formed as a microstrip line and a strip line.

5. The differential amplification circuit according to claim 1, further comprising:
   a balun connected to an output side of the differential amplifier,
   wherein the first and second filters are connected between the differential amplifier and the balun.
6. The differential amplification circuit according to claim 1, further comprising:
   a balun connected to an output side of the differential amplifier; and
   a third capacitor connected between a midpoint of a wire of a primary-side inductor in the balun and a reference potential,
   wherein the second filter comprises a resonant circuit comprising the primary-side inductor and the third capacitor.
7. The differential amplification circuit according to claim 1,
   wherein the center frequency of the first filter is 0.9 times the center frequency of the even harmonic, and
   the center frequency of the second filter is 1.1 times the center frequency of the even harmonic.
8. A differential amplification circuit comprising:
   a differential amplifier configured to output a signal including harmonics; and
   first and second filters connected to an output of the differential amplifier,
   wherein the first filter comprises a first resonant circuit comprising a first capacitor and a first inductor,
   the second filter comprises a second resonant circuit comprising a second capacitor and a second inductor,
   a capacitance value of the first capacitor is greater than a capacitance value of the second capacitor, and
   an inductance value of the first inductor is less than an inductance value of the second inductor.
9. The differential amplification circuit according to claim 8,
   wherein the first resonant circuit of the first filter further comprises a third inductor, and
   wherein the second resonant circuit of the second filter further comprises a fourth inductor.
10. The differential amplification circuit according to claim 8, wherein the first inductor or the second inductor is formed as a microstrip line and a strip line.
11. The differential amplification circuit according to claim 8, further comprising:
    a balun connected to an output side of the differential amplifier,
    wherein the first and second filters are connected between the differential amplifier and the balun.
12. The differential amplification circuit according to claim 8, further comprising:
    a balun connected to an output side of the differential amplifier,
    wherein the second inductor is a primary-side inductor of the balun, and
    wherein the second capacitor is connected between a midpoint of a wire of the primary-side inductor and a reference potential.

* * * * *